US007630501B2

(12) United States Patent
Blank et al.

(10) Patent No.: US 7,630,501 B2
(45) Date of Patent: Dec. 8, 2009

(54) SYSTEM AND METHOD FOR CALIBRATION OF AN ACOUSTIC SYSTEM

(75) Inventors: William Tom Blank, Bellevue, WA (US); Kevin M. Schofield, Bellevue, WA (US); Kirk O. Olynyk, Redmond, WA (US); Robert G. Atkinson, Woodinville, WA (US); James David Johnston, Redmond, WA (US); Michael W. Van Flandern, Seattle, WA (US)

(73) Assignee: Microsoft Corporation, Redmond, WA (US)

(*) Notice: Subject to any disclaimer, the term of this patent is extended or adjusted under 35 U.S.C. 154(b) by 765 days.

(21) Appl. No.: 10/845,127

(22) Filed: May 14, 2004

(65) Prior Publication Data

US 2005/0254662 A1 Nov. 17, 2005

(51) Int. Cl.

| | |
|---|---|
| ***H04R 29/00*** | (2006.01) |
| ***H04R 5/02*** | (2006.01) |
| ***H03G 3/00*** | (2006.01) |
| ***H04B 3/00*** | (2006.01) |
| ***H04R 3/00*** | (2006.01) |
| ***G10K 11/00*** | (2006.01) |
| ***G01R 27/28*** | (2006.01) |

(52) U.S. Cl. ............................ 381/58; 381/59; 381/56; 381/300; 381/303; 381/61; 381/77; 381/96; 702/103; 702/117

(58) Field of Classification Search .................. 381/55, 381/58, 300, 303, 59, 77, 61, 96; 702/103, 702/117

See application file for complete search history.

(56) References Cited

U.S. PATENT DOCUMENTS

| | | | | |
|---|---|---|---|---|
| 7,123,731 | B2 * | 10/2006 | Cohen et al. | 381/303 |
| 7,155,017 | B2 * | 12/2006 | Kim et al. | 381/59 |
| 2003/0118194 | A1 * | 6/2003 | Neumann et al. | 381/59 |

* cited by examiner

*Primary Examiner*—Vivian Chin
*Assistant Examiner*—George C Monikang
(74) *Attorney, Agent, or Firm*—Shook, Hardy & Bacon LLP

(57) ABSTRACT

The present invention is directed to a method and system for automatic calibration of an acoustic system. The acoustic system may include a source A/V device, calibration computing device, and multiple rendering devices. The calibration system may include a calibration component attached to each rendering device and a source calibration module. The calibration component on each rendering device includes a microphone. The source calibration module includes distance and optional angle calculation tools for automatically determining a distance between the rendering device and a specified reference point upon return of the test signal from the calibration component.

52 Claims, 11 Drawing Sheets

```
clear all
close all
fs=44100;

len=1024

bottom=fix(500/44100*len)
top=fix(10000/44100*len)

a(len)=0;
a(1)=0;
for i=bottom:top
x=2*pi*sin(32*pi*i/len)+2*pi*(i-1)/2+2*pi*sin(16*2*pi*i);
x=x+2*pi*sin(8*2*pi*i);
a(i)=cos(x)+ j * sin(x);
end

a(len/2+1)=0;

for i=len/2+2:len
a(i)=conj(a(len+2-i));
end

b=ifft(a);

b=real(b);
plot(b);
figure
c(len:-1:1)=b(1:len);
plot(c)
d=conv(b,c);

figure
plot(d)
figure
xx=(1:8192)*22050/8192;
z=10*log10(abs(fft(d,16384)));
plot(xx,z(1:8192));
```

FIG. 11

SYSTEM AND METHOD FOR CALIBRATION OF AN ACOUSTIC SYSTEM

CROSS-REFERENCE TO RELATED APPLICATIONS

None

STATEMENT REGARDING FEDERALLY SPONSORED RESEARCH OR DEVELOPMENT

None.

TECHNICAL FIELD

Embodiments of the present invention relate to the field of automatic calibration of audio/video (A/V) equipment. More particularly, embodiments of the invention relate to automatic surround sound system calibration in a home entertainment system.

BACKGROUND OF THE INVENTION

In recent years, home entertainment systems have moved from simple stereo systems to multi-channel audio systems such as surround sound systems and to systems with video displays. Such systems have complicated requirements both for initial setup and for subsequent use. Furthermore, such systems have required an increase in the number and type of necessary control devices.

Currently, setup for such complicated systems often requires a user to obtain professional assistance. Current home theater setups include difficult wiring and configuration steps. For example, current systems require each speaker to be properly connected to an appropriate output on the back of an amplifier with the correct polarity. Current systems request that the distance from each speaker to a preferred listening position be manually measured. This distance must then be manually entered into the surround amplifier system or the system will perform poorly compared to a properly calibrated system Further, additional mechanisms to control peripheral features such as DVD players, DVD jukeboxes, Personal Video Recorders (PVRs), room lights, window curtain operation, audio through an entire house or building, intercoms, and other elaborate command and control systems have been added to home theater systems. These systems are complicated due to the necessity for integrating multi-vendor components using multiple controllers. These multi-vendor components and multiple controllers are poorly integrated with computer technologies. Most users are able to install only the simplest systems. Even moderately complicated systems are usually installed using professional assistance.

A new system is needed for automatically calibrating home user audio and video systems in which users will be able to complete automatic setup without difficult wiring or configuration steps. Furthermore, a system is needed that integrates a sound system seamlessly with a computer system, thereby enabling a home computer to control and interoperate with a home entertainment system. Furthermore, a system architecture is needed that enables independent software and hardware vendors (ISVs & IHVs) to supply easily integrated additional components.

BRIEF SUMMARY OF THE INVENTION

Embodiments of the present invention are directed to a calibration system for automatically calibrating a surround sound audio system e.g. a 5.1, 7.1 or larger acoustic system. The acoustic system includes a source A/V device (e.g. CD player), a computing device, and at least one rendering device (e.g. a speaker). The calibration system includes a calibration component attached to at least one selected rendering device and a source calibration module located in a computing device (which could be part of a source A/V device, rendering A/V device, or computing device e.g. a PC). The source calibration module includes distance and optionally angle calculation tools for automatically determining a distance between the rendering device and a specified reference point upon receiving information from the rendering device calibration component.

In an additional aspect, the method includes receiving a test signal at a microphone attached to a rendering device, transmitting information from the microphone to a the calibration module, and automatically calculating, at the calibration module, a distance between the rendering device and a fixed reference point based on a travel time of the received test signal.

In yet a further aspect, the invention is directed to a method for calibrating an acoustic system including at least a source A/V device, computing device and a first and a second rendering device. The method includes generating an audible test signal from the first rendering device at a selected time and receiving the audible test signal at the second rendering device at a reception time. The method additionally includes transmitting information pertaining to the received test signal from the second rendering device to the calibration computing device and calculating a distance between the second rendering device and the first rendering device based on the selected time and the reception time.

In an additional aspect, the invention is directed to a calibration module operated by a computing device for automatically calibrating acoustic equipment in an acoustic system. The acoustic system includes at least one rendering device having an attached microphone. The calibration module includes input processing tools for receiving information from the microphone and distance calculation tools for automatically determining a distance between the rendering device attached to the microphone and a specified reference point based on the information from the microphone.

In yet additional aspects, the invention is directed to automatically identifying the position of each speaker within a surround-sound system and to calibrating the surround-sound system to accommodate a preferred listening position.

BRIEF DESCRIPTION OF THE DRAWINGS

The present invention is described in detail below with reference to the attached drawings figures, wherein:

FIG. 11 illustrates Matlab source code to produce the test signal in accordance with an embodiment of the invention;

DETAILED DESCRIPTION OF THE INVENTION

System Overview

Embodiments of the present invention are directed to a system and method for automatic calibration in an audio-visual (A/V) environment. In particular, multiple source devices are connected to multiple rendering devices. The rendering devices may include speakers and the source devices may include a calibration computing device. At least one of the speakers includes a calibration component including a microphone. In embodiments of the invention, more than one or all speakers include a calibration component. The calibration computing device includes a calibration module that is capable of interacting with each microphone-equipped speaker for calibration purposes.

Figure 1:
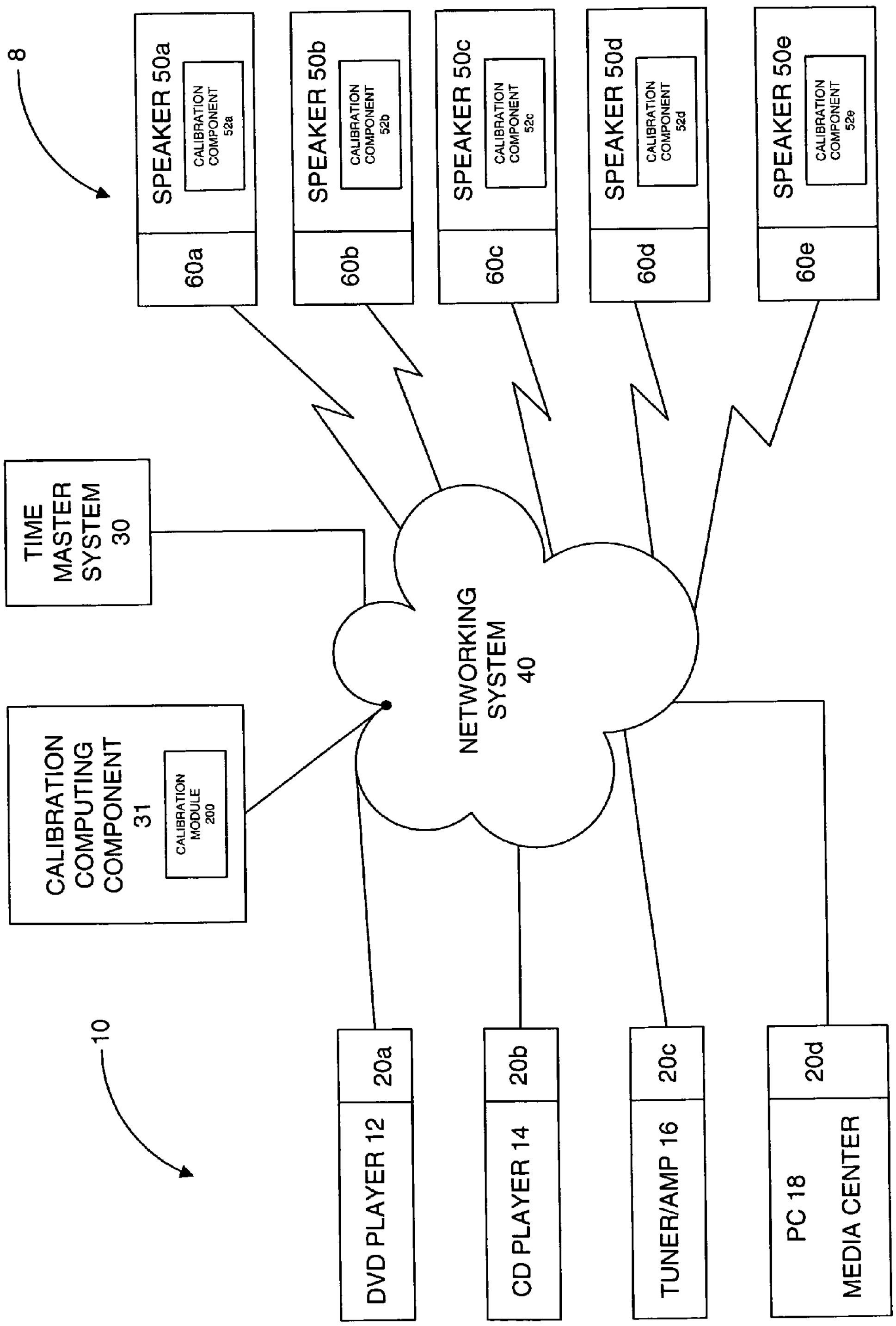
FIG. 1 is a block diagram illustrating components of an acoustic system for use in accordance with an embodiment of the invention.

An exemplary system embodiment is illustrated in FIG. 1. Various A/V source devices 10 may be connected via an IP networking system 40 to a set of rendering devices 8. In the displayed environment, the source devices 10 include a DVD player 12, a CD Player 14, a tuner 16, and a personal computer (PC) Media Center 18. Other types of source devices may also be included. The networking system 40 may include any of multiple types of networks such as a Local Area Network (LAN), Wide Area Network (WAN) or the Internet. Internet Protocol (IP) networks may include IEEE 802.11(a,b,g), 10/100Base-T, and HPNA. The networking system 40 may further include interconnected components such as a DSL modem, switches, routers, coupling devices, etc. The rendering devices 8 may include multiple speakers 50*a*-50*e* and/or displays. A time master system 30 facilitates network synchronization and is also connected to the networking system 40. A calibration computing device 31 performs the system calibration functions using a calibration module 200.

In the embodiment of the system shown in FIG. 1, the calibration computing device 31 includes a calibration module 200. In additional embodiments, the calibration module could optionally be located in the Media Center PC 18 or other location. The calibration module 200 interacts with each of a plurality of calibration components 52*a*-52*e* attached to the speakers 50*a*-50*e*. The calibration components 52*a*-52*e* each include: a microphone, a synchronized internal clock, and a media control system that collects the microphone data, time stamps the data, and forwards the information to the calibration module 200. This interaction will be further described below with reference to FIGS. 4 and 5.

As set forth in U.S. patent application Ser. Nos. 10/306,340 and U.S. Patent Publication No. 2002-0150053, hereby incorporated by reference, the system shown in FIG. 1 addresses synchronization problems through the use of combined media and time synchronization logic (MaTSyL) 20*a*-20*d* associated with the source devices 10 and MaTSyLs 60*a*-60*e* associated with the rendering devices 8. The media and time synchronization logic may be included in the basic device (e.g. a DVD player) or older DVD devices could use an external MaTSyl in the form of an audio brick. In either case, the MaTSyl is a combination of hardware and software components that provide an interchange between the networking system 40 and traditional analog (or digital) circuitry of an A/V component or system.

Figure 2:
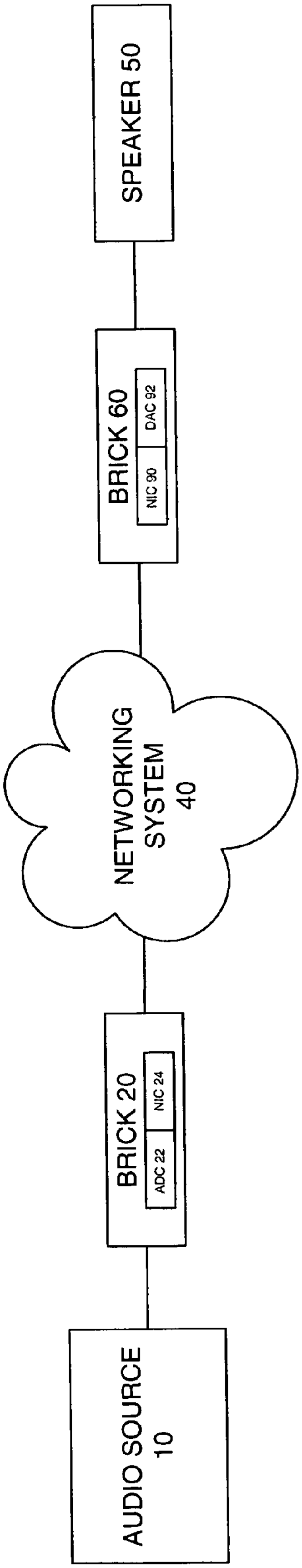
FIG. 2 is a block diagram illustrating further details of a system in accordance with an embodiment of the invention.

FIG. 2 illustrates an arrangement for providing synchronization between a source audio device 10 and a rendering device 50. A brick 20 connected with a source device 10 may include an analog-to-digital converter 22 for handling analog portions of the signals from the source device 10. The brick 20 further includes a network connectivity device 24. The network connectivity device 24 may include for example a 100Base-T NIC, which may be wired to a 10/100 switch of the networking system 40. On the rendering side, a brick 60 may include a network interface such as a 100Base-T NIC 90 and a digital-to-analog converter (DAC) 92. The brick 60 converts IP stream information into analog signals that can be played by the speaker 50. The synchronization procedure is described in greater detail in the above-mentioned co-pending patent application that is incorporated by reference. The brick 20 logic may alternatively be incorporated into the audio source 10 and the brick 60 logic may be incorporated into the speaker 50.

Exemplary Operating Environment

Figure 3:
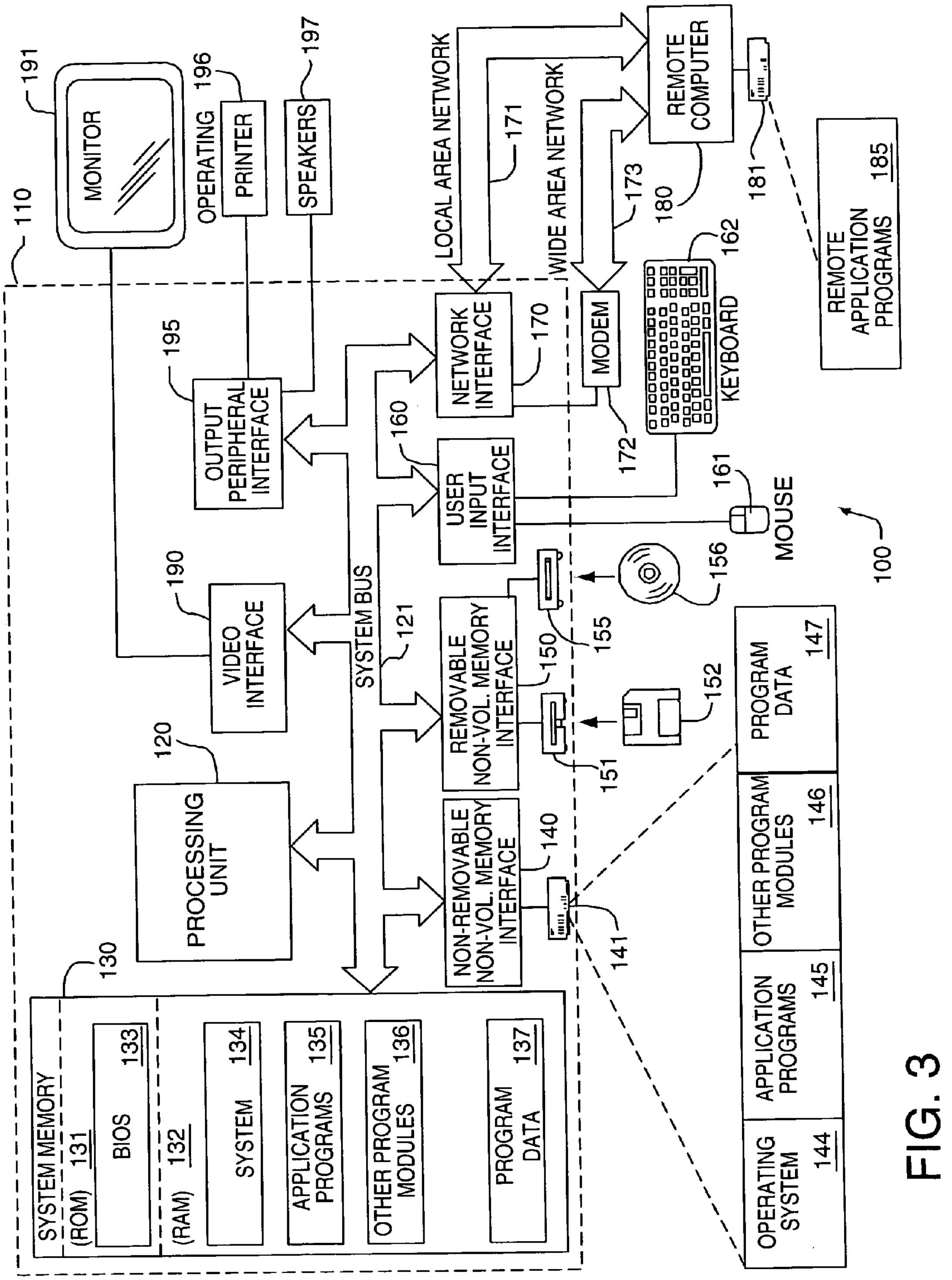
FIG. 3 is a block diagram illustrating a computerized environment in which embodiments of the invention may be implemented.

FIG. 3 illustrates an example of a suitable computing system environment 100 for the calibration computing device 31 on which the invention may be implemented. The computing system environment 100 is only one example of a suitable computing environment and is not intended to suggest any limitation as to the scope of use or functionality of the invention. Neither should the computing environment 100 be interpreted as having any dependency or requirement relating to any one or combination of components illustrated in the exemplary operating environment 100.

The invention is described in the general context of computer-executable instructions, such as program modules, being executed by a computer. Generally, program modules include routines, programs, objects, components, data structures, etc. that perform particular tasks or implement particular abstract data types. Moreover, those skilled in the art will appreciate that the invention may be practiced with other computer system configurations, including hand-held devices, multiprocessor systems, microcontroller-based, microprocessor-based, or programmable consumer electronics, minicomputers, mainframe computers, and the like. The invention may also be practiced in distributed computing environments where tasks are performed by remote processing devices that are linked through a communications network. In a distributed computing environment, program modules may be located in both local and remote computer storage media including memory storage devices.

With reference to FIG. 3, the exemplary system 100 for implementing the invention includes a general purpose-computing device in the form of a computer 110 including a processing unit 120, a system memory 130, and a system bus 121 that couples various system components including the system memory to the processing unit 120.

Computer 110 typically includes a variety of computer readable media. By way of example, and not limitation, computer readable media may comprise computer storage media and communication media. The system memory 130 includes computer storage media in the form of volatile and/or nonvolatile memory such as read only memory (ROM) 131 and random access memory (RAM) 132. A basic input/output system 133 (BIOS), containing the basic routines that help to transfer information between elements within computer 110, such as during start-up, is typically stored in ROM 131. RAM 132 typically contains data and/or program modules that are immediately accessible to and/or presently being operated on by processing unit 120. By way of example, and not limitation, FIG. 3 illustrates operating system 134, application programs 135, other program modules 136, and program data 137.

The computer 110 may also include other removable/nonremovable, volatile/nonvolatile computer storage media. By way of example only, FIG. 3 illustrates a hard disk drive 141 that reads from or writes to nonremovable, nonvolatile magnetic media, a magnetic disk drive 151 that reads from or writes to a removable, nonvolatile magnetic disk 152, and an optical disk drive 155 that reads from or writes to a removable, nonvolatile optical disk 156 such as a CD ROM or other optical media. Other removable/nonremovable, volatile/nonvolatile computer storage media that can be used in the exemplary operating environment include, but are not limited to, magnetic tape cassettes, flash memory cards, digital versatile disks, digital video tape, solid state RAM, solid state ROM, and the like. The hard disk drive 141 is typically connected to the system bus 121 through an non-removable memory interface such as interface 140, and magnetic disk drive 151 and optical disk drive 155 are typically connected to the system bus 121 by a removable memory interface, such as interface 150.

The drives and their associated computer storage media discussed above and illustrated in FIG. 3, provide storage of computer readable instructions, data structures, program modules and other data for the computer 110. In FIG. 3, for example, hard disk drive 141 is illustrated as storing operating system 144, application programs 145, other program modules 146, and program data 147. Note that these components can either be the same as or different from operating system 134, application programs 135, other program modules 136, and program data 137. Operating system 144, application programs 145, other program modules 146, and program data 147 are given different numbers here to illustrate that, at a minimum, they are different copies. A user may enter commands and information into the computer 110 through input devices such as a keyboard 162 and pointing device 161, commonly referred to as a mouse, trackball or touch pad. Other input devices (not shown) may include a microphone, joystick, game pad, satellite dish, scanner, or the like. These and other input devices are often connected to the processing unit 120 through a user input interface 160 that is coupled to the system bus, but may be connected by other interface and bus structures, such as a parallel port, game port or a universal serial bus (USB). A monitor 191 or other type of display device is also connected to the system bus 121 via an interface, such as a video interface 190. In addition to the monitor, computers may also include other peripheral output devices such as speakers 197 and printer 196, which may be connected through an output peripheral interface 195.

The computer 110 in the present invention will operate in a networked environment using logical connections to one or more remote computers, such as a remote computer 180. The remote computer 180 may be a personal computer, and typically includes many or all of the elements described above relative to the computer 110, although only a memory storage device 181 has been illustrated in FIG. 3. The logical connections depicted in FIG. 3 include a local area network (LAN) 171 and a wide area network (WAN) 173, but may also include other networks.

When used in a LAN networking environment, the computer 110 is connected to the LAN 171 through a network interface or adapter 170. When used in a WAN networking environment, the computer 110 typically includes a modem 172 or other means for establishing communications over the WAN 173, such as the Internet. The modem 172, which may be internal or external, may be connected to the system bus 121 via the user input interface 160, or other appropriate mechanism. In a networked environment, program modules depicted relative to the computer 110, or portions thereof, may be stored in the remote memory storage device. By way of example, and not limitation, FIG. 3 illustrates remote application programs 185 as residing on memory device 181. It will be appreciated that the network connections shown are exemplary and other means of establishing a communications link between the computers may be used.

Although many other internal components of the computer 110 are not shown, those of ordinary skill in the art will appreciate that such components and the interconnection are well known. Accordingly, additional details concerning the internal construction of the computer 110 need not be disclosed in connection with the present invention.

Calibration Module and Components

Figure 4:
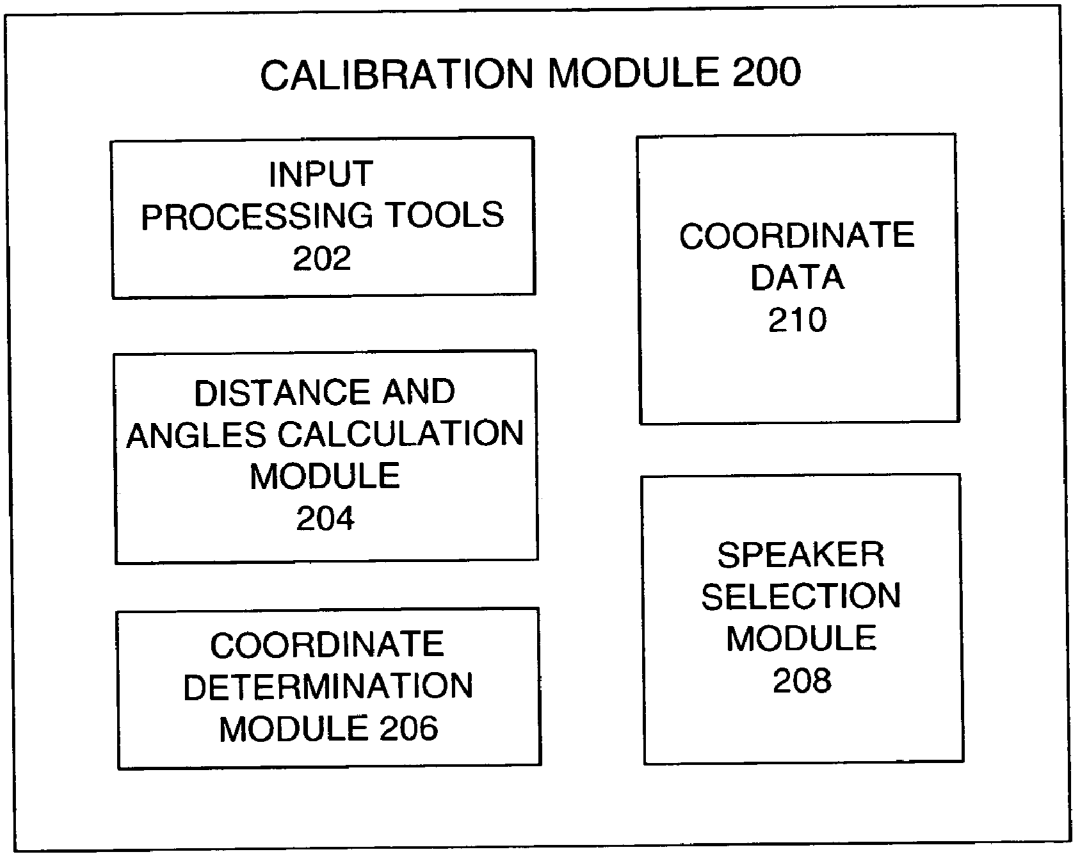
FIG. 4 is a block diagram illustrating a calibration module for automatic acoustic calibration in accordance with an embodiment of the invention.

FIG. 4 illustrates a calibration module 200 for calibrating the system of FIG. 1 from the calibration computing device 31. The calibration module 200 may be incorporated in a memory of the calibration computing device 31 such as the RAM 132 or other memory device as described above with reference to FIG. 3. The calibration module 200 may include input processing tools 202, a distance and angle calculation module 204, a coordinate determination module 206, a speaker selection module 208, and coordinate data 210. The calibration module 200 operates in conjunction with the calibration components **52*a*-52*e* found in the speakers 50*a*-50*e* to automatically calibrate the system shown in FIG. 1**.

As set forth above, the calibration components **52*a*-52*e* preferably include at least one microphone, a synchronized internal clock, and a media control system that collects microphone data, time-stamps the data, and forwards the information to the calibration module 200. Regarding the components of the calibration module 200, the input processing tools 202 receive a test signal returned from each rendering device 8. The speaker selection module 208 ensures that each speaker has an opportunity to generate a test signal at a precisely selected time. The distance and angle calculation module 204 operates based on the information received by the input processing tools 202 to determine distances and angles between participating speakers or between participating speakers and pre-set fixed reference points. The coordinate determination module 206 determines precise coordinates of the speakers relative to a fixed origin based on the distance and angle calculations. The coordinate data storage area 210 stores coordinate data generated by the coordinate determination module 206**.

The calibration system described above can locate each speaker within a surround sound system and further, once each speaker is located, can calibrate the acoustic system to accommodate a preferred listening position. Techniques for performing these functions are further described below in conjunction with the description of the surround-sound system application.

Method of the Invention

Figure 5:
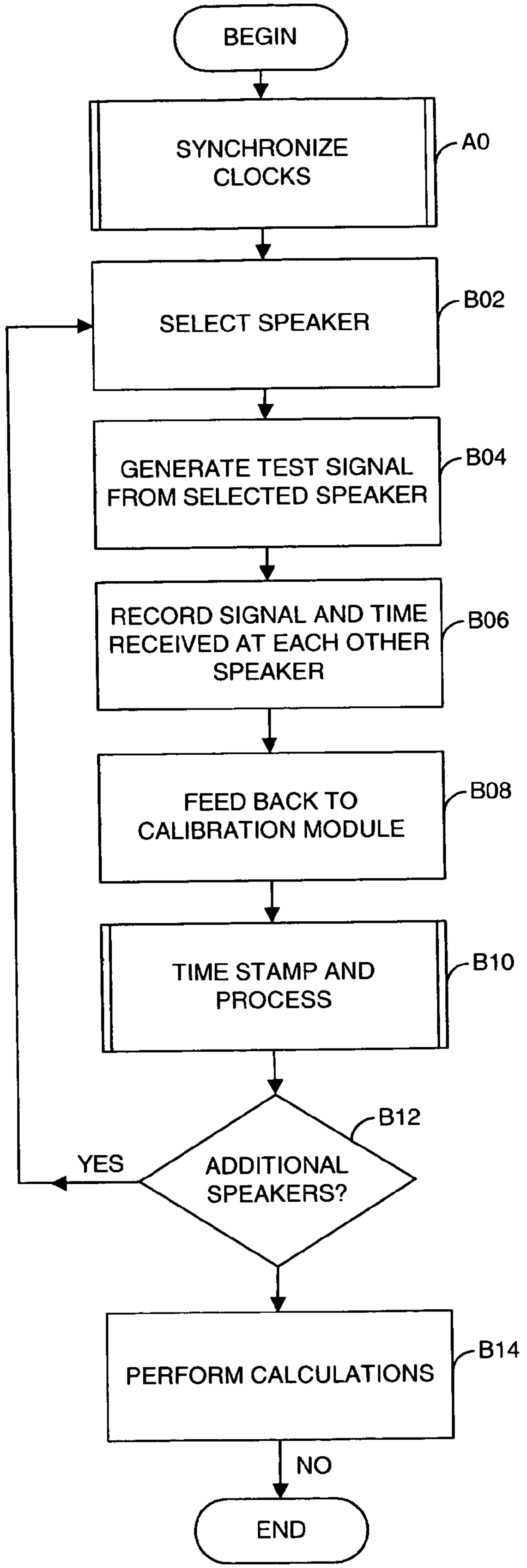
FIG. 5 is a flow chart illustrating a calibration method in accordance with an embodiment of the invention.

FIG. 5 is a flow chart illustrating a calibration process performed with a calibration module 200 and the calibration components 52*a*-52*e*. In step A0, synchronization of clocks of each device of the system is performed as explained in co-pending application Ser. No. 10/306,340, which is incorporated herein by reference. In an IP speaker system such as that shown in FIG. 1, all of the speakers 50*a*-50*e* are time synchronized with each other. The internal clocks of each speaker are preferably within 50 us of a global clock maintained by the time master system 30. This timing precision may provide roughly +/− one half inch of physical position resolution since the speed of sound is roughly one foot per millisecond.

In step B02 after the calibration module 200 detects connection of one or more speakers using any one of a variety of mechanisms including uPnP and others, the calibration module 200 selects a speaker. In step B04, the calibration module 200 causes a test signal to be played at a precise time based on the time master system 30 from the selected speaker. Sound can be generated from an individual speaker at a precise time as discussed in the aforementioned patent application.

In step B06, each remaining speaker records the signal using the provided microphone and time-stamps the reception using the speaker's internal clock. By playing a sound in one speaker at a precise time, the system enables all other speakers to record the calibration signal and the time it was received at each speaker.

In step B08, the speakers use the microphone to feed the test signal and reception time back to the input processing tools 202 of the calibration module 200. In step B10, the calibration module 200 time stamps and processes the received test signal. All samples are time-stamped using global time. The calibration computing device 31 processes the information from each of the calibration components 52*a*-52*e* on each speaker 50*a*-50*e*. Optionally, only some of the speakers include a calibration component. Processing includes deriving the amount of time that it took for a generated test signal to reach each speaker from the time-stamped signals recorded at each speaker.

In step B12, the calibration system 200 may determine if additional speakers exist in the system and repeat steps B04-B12 for each additional speaker.

In step B14, the calibration module makes distance and optionally angle calculations and determines the coordinates of each component of the system. These calibration steps are performed using each speaker as a sound source upon selection of each speaker by the speaker selection module 208. The distance and angles can be calculated by using the time it takes for each generated test signal to reach each speaker Taking into account the speed of the transmitted sound, the distance between the test signal generating speaker and a rendering speaker is equal to the speed of sound multiplied by the elapsed time.

In some instances the aforementioned steps could be performed in an order other than that specified above. The description is not intended to be limiting with respect to the order of the steps.

Numerous test signals can be used for the calibration steps including: simple monotone frequencies, white noise, bandwidth limited noise, and others. The most desirable test signal attribute generates a strong correlation function peak supporting both accurate distance and angle measurements especially in the presence of noise. FIGS. 11 through 14 provide the details on a test signal that demonstrates excellent characteristics.

Figure 12:
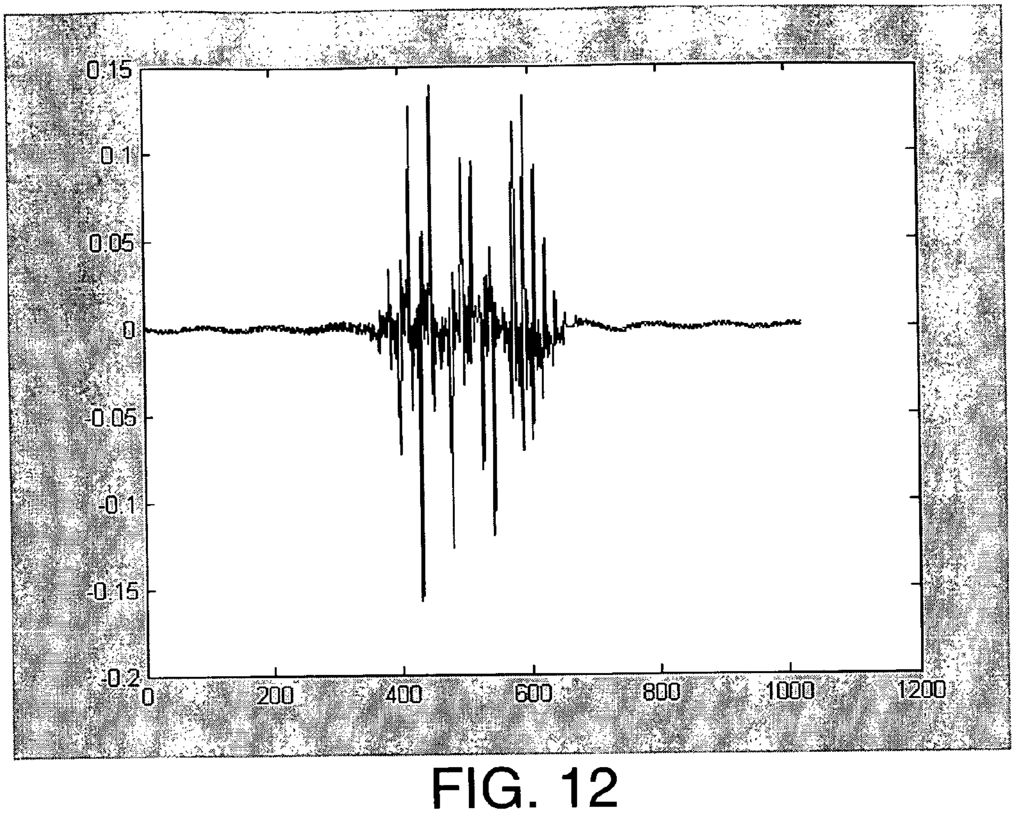
FIG. 12 illustrates a time plot of the test signal in accordance with an embodiment of the invention.

Specifically, FIG. 11 shows the MatLab code that was used to generate the test signal (shown in FIG. 12). This code is representative of a large family of test signals that can vary in duration, sampling frequency, and bandwidth while still maintaining the key attributes.

Figure 13:
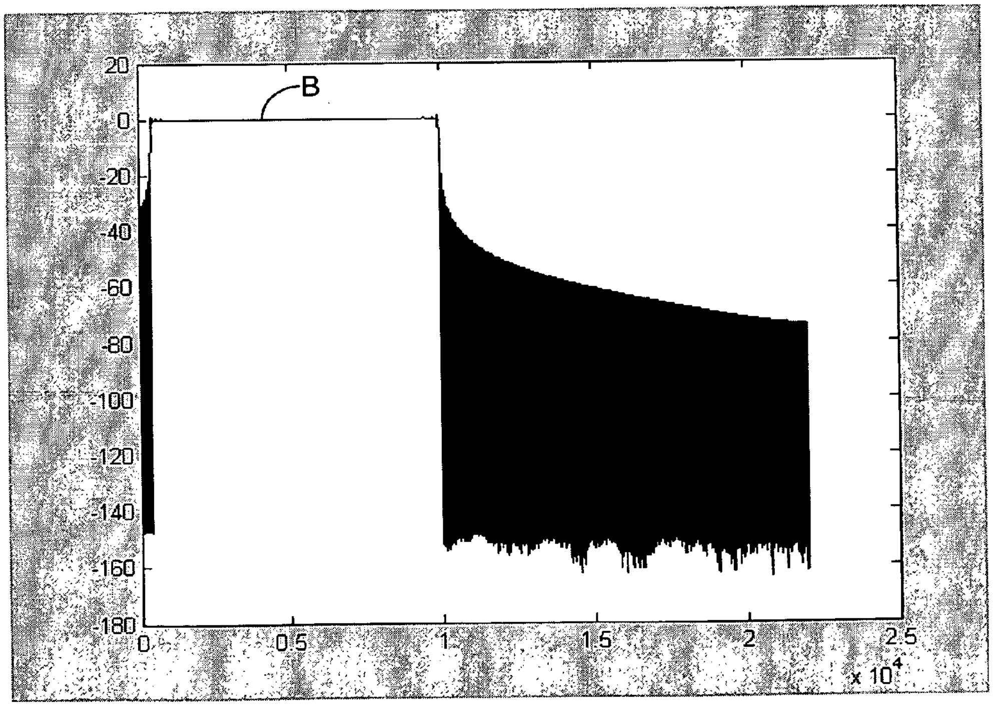
FIG. 13 illustrates a frequency plot of the test signal in accordance with an embodiment of the invention.
Figure 14:
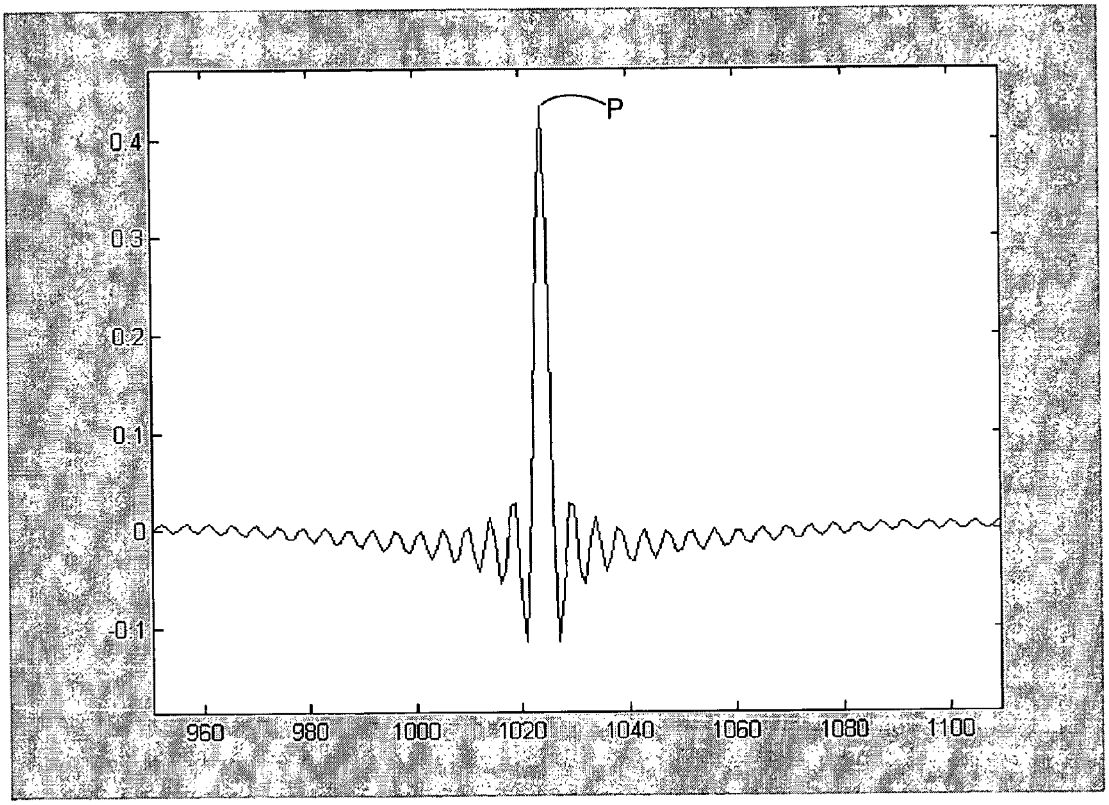
FIG. 14 illustrates a correlation function output of two test signals in accordance with an embodiment of the invention.

FIG. 12 illustrates signal amplitude along the y axis vs. time along the x-axis. FIG. 13 is a test signal plot obtained through taking a Fast Fourier Transform of the test signal plot of FIG. 12. In FIG. 13, the y axis represents magnitude and the x-axis represents frequency. A flat frequency response band B causes the signal to be easily discernable from other noise existing within the vicinity of the calibration system. FIG. 14 illustrates a test signal correlation plot. The y axis represents magnitude and the x axis represents samples. A sharp central peak P enables precise measurement. In addition, by correlating the signal with the received signal in a form of matched filter, the system is able to reject room noise that is outside the band of the test signal.

Accordingly, the key attributes of the signal include its continuous phase providing a flat frequency plot (as shown in FIG. 13), and an extremely large/narrow correlation peak as shown in FIG. 14. Furthermore, the signal does not occur in nature as only an electronic or digital synthesis process could generate this kind of waveform.

Surround Sound System Application

Figure 6:
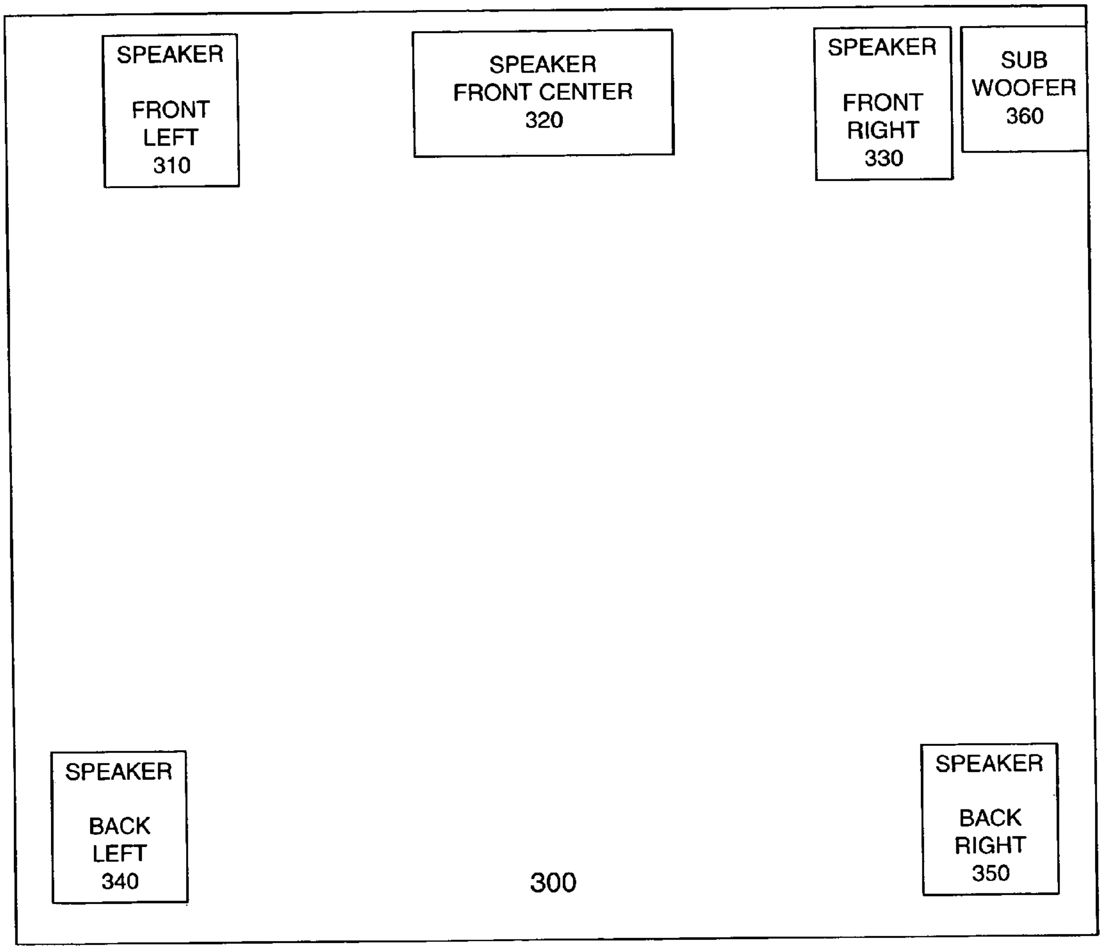
FIG. 6 illustrates a surround-sound system for use in accordance with an embodiment of the invention.

FIG. 6 illustrates a 5.1 surround sound system that may be calibrated in accordance with an embodiment of the invention. As set forth above, the system integrates IP based audio speakers with imbedded microphones. In a five-speaker surround sound system, some of the five speakers include one or more microphones. The speakers may initially be positioned within a room. As shown in FIG. 6, the system preferably includes a room 300 having a front left speaker 310, a front center speaker 320, a front right speaker 330, a back left speaker 340, and a back right speaker 350. The system preferably also includes a sub woofer 360. The positioning of the sub-woofer is flexible because of the non-directional nature of the bass sound. After the speakers are physically installed and connected to both power and the IP network, the calibration computing device 31 will notice that new speakers are installed.

The calibration computing device 31 will initially guess at a speaker configuration. Although the calibration computing device 31 knows that five speakers are connected, it does not know their positions. Accordingly, the calibration computing device 31 makes an initial guess at an overall speaker configuration. After the initial guess, the calibration computing device 31 will initiate a calibration sequence as described above with reference to FIG. 5. The calibration computing device 31 individually directs each speaker to play a test signal. The other speakers with microphones listen to the test signal generating speaker. The system measures both the distance (and possibly the angle in embodiments in which two microphones are present) from each listening speaker to the source speaker. As each distance is measured, the calibration computing device 31 is able to revise its original positioning guess with its acquired distance knowledge. After all of the measurements are made, the calibration computing device will be able to determine which speaker is in which position. Further details of this procedure are described below in connection with speaker configurations.

Figure 7:
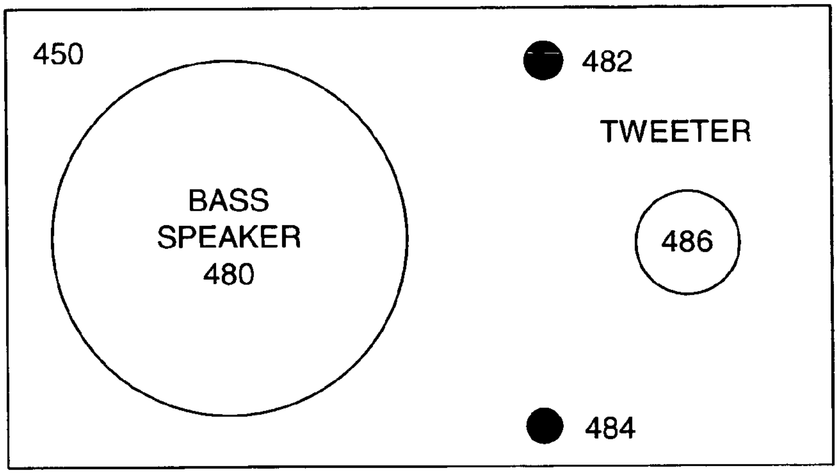
FIG. 7 illustrates a speaker configuration in accordance with an embodiment of the invention.

FIG. 7 illustrates a speaker configuration in accordance with an embodiment of the invention. This speaker orientation may be used with a center speaker shown in FIG. 6 in accordance with an embodiment of the invention. The speaker 450 may optionally include any of a bass speaker 480, a midrange speaker, and a high frequency speaker 486, and microphones 482 and 484. Other speaker designs are possible and will also work within this approach. If the center speaker is set up in a horizontal configuration as shown, then the two microphones 482 and 484 are aligned in a vertical direction. This alignment allows the calibration module 200 to calculate the vertical angle of a sound source. Using both the horizontal center speaker and other vertical speakers, the system can determine the x, y, and z coordinates of any sound source.

Figure 8:
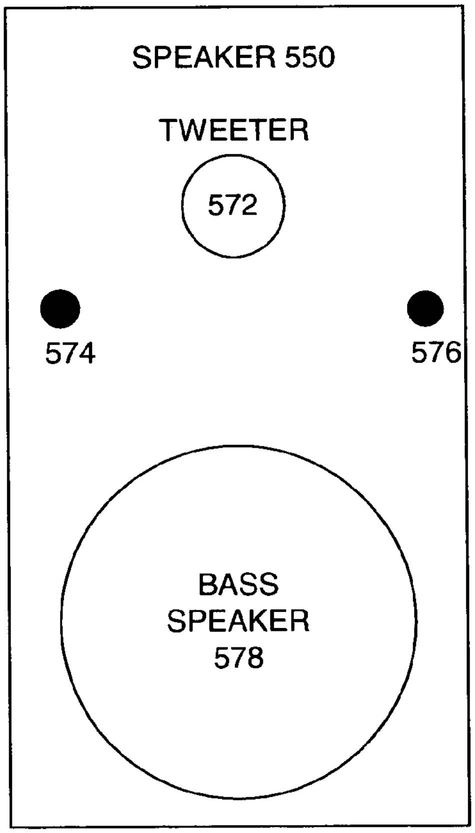
FIG. 8 illustrates an additional speaker configuration in accordance with an embodiment of the invention.

FIG. 8 illustrates a two-microphone speaker configuration in accordance with an embodiment of the invention. This speaker configuration is preferably used for the left and right speakers of FIG. 6 in accordance with an embodiment of the invention. The speaker 550 may include a tweeter 572, a bass speaker 578, and microphones 574 and 576. In this two-microphone system, the spacing is preferably six inches (or more) in accordance with an embodiment of the invention in order to provide adequate angular resolution for sound positioning.

The optional angle information is computed by comparing the relative arrival time on a speaker's two microphones. For example, if the source is directly in front of the rendering speaker, the sound will arrive at the two microphones at the exact same time. If the sound source is a little to the left, it will arrive at the left microphone a little earlier than the right microphone. The first step calculating the angle requires computing the number of samples difference between the two microphones in the arrival time of the test signal. This can be accomplished with or without knowing the time when the test signal was sent using a correlation function. Then, the following C# code segment performs the angle computation (See Formula (1) below):

```
angle_delta=(90.0-(180.0/Math.PI)*Math.A cos
    (sample_delta*1116.0/(0.5*44100.0)));            (1)
```

This example assumes a 6" microphone separation and a 44100 sample rate system where the input sample_delta is the test signal arrival difference between the two microphones in samples. The output is in degrees off dead center.

Using the distance and angle information, the relative x and y positioning of each speaker in this system can be determined and stored as coordinate data 210. The zero reference coordinates may be arbitrarily located at the front center speaker, preferred listening position or other selected reference point.

Figure 9:
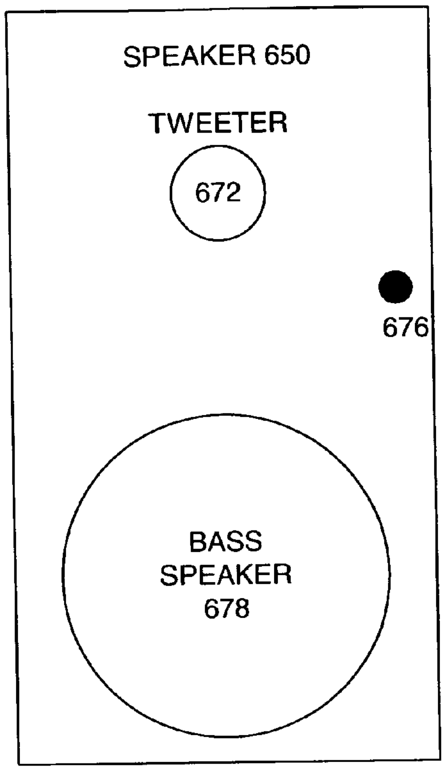
FIG. 9 illustrates an alternative speaker and microphone configuration in accordance with an embodiment of the invention.
Figure 10:
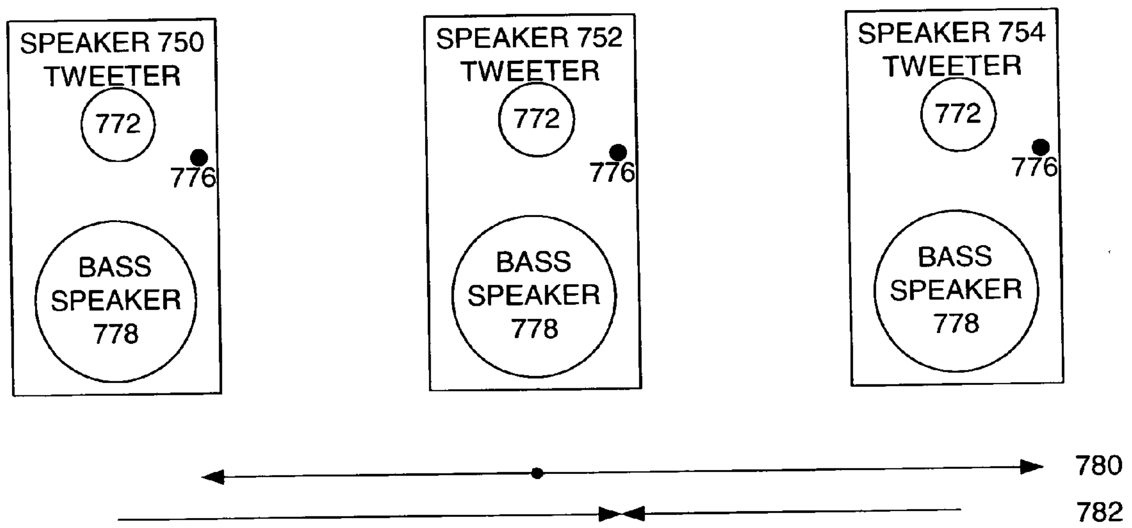
FIG. 10 illustrates a computation configuration for determining left right position using one microphone in accordance with an embodiment of the invention.

Alternatively, a single microphone could be used in each speaker to compute the x and y coordinates of each speaker. FIG. 9 shows a speaker 650 with only one microphone 676. In this approach, each speaker measures the distance to each other speaker. FIG. 10 shows the technique for determining which of the front speakers are on the left and right sides. FIG. 10 shows a front left speaker 750, a center speaker 752, and a front right speaker 754. Assuming each microphone 776 is placed right of center then, for the left speaker 750 audio takes longer to travel from the outside speaker to the center speaker 752 than from the center speaker 752 to the outside speaker 750. For the right speaker 754, audio takes longer to travel from the center speaker 752 to the outside speaker 754 than from the outside speaker 754 to the center speaker 752. This scenario is shown by arrows 780 and 782.

In the surround sound system shown in FIG. 6, another use for the calibration system described above is the application of calibration to accommodate a preferred listening position. In many situations, a given location, such as a sofa or chair in a user's home will be placed in a preferred listening position. In this instance, given the location of the preferred listening position, which can be measured by generating a sound from the preferred listening position, the time it takes for sound from each speaker to reach the preferred listening position can be calculated with the calibration computing device 31. Optimally, the sound from each speaker will reach the preferred listening position simultaneously. Given the distances calculated by the calibration computing device 31, the delays and optionally gain in each speaker can be adjusted in order to cause the sound generated from each speaker to reach the preferred listening position simultaneously with the same acoustic level.

Additional Application Scenarios

Further scenarios include the use of a remote control device provided with a sound generator. A push of a remote button would provide the coordinates of the controller to the system. In embodiments of the system, a two-click scenario may provide two reference points allowing the construction of a room vector, where the vector could point at any object in the room. Using this approach, the remote can provide a mechanism to control room lights, fans, curtains, etc. In this system, the input of physical coordinates of an object allows subsequent use and control of the object through the system. The same mechanism can also locate the coordinates of any sound source in the room with potential advantages in rendering a soundstage in the presence of noise, or for other purposes.

Having a calibration module 200 that determines and stores the x, y, and optionally z coordinates of controllable objects allows for any number of application scenarios. For example, the system can be structured to calibrate a room by clicking at the physical location of lamps or curtains in a room. From any location, such as an easy chair, the user can click establishing the resting position coordinates. The system will interpret each subsequent click as a vector from the resting click position to the new click position. With two x, y, z coordinate pairs, a vector can then be created which points at room objects. Pointing at the ceiling could cause the ceiling lights to be controlled and pointing at a lamp could cause the lamp to be controlled. The aforementioned clicking may occur with the user's fingers or with a remote device, such as an infrared (IR) remote device modified to emit an audible click.

In some embodiments of the invention, only one microphone in each room is provided. In other embodiments, each speaker in each room may include one or more microphones. Such systems can allow leveraging of all IP connected components. For example, a baby room monitor may, through the system of the invention, connect the sounds from a baby's room to the appropriate monitoring room or to all connected speakers. Other applications include: room to room intercom, speaker phone, acoustic room equilibration etc.

Stand Alone Calibration Application

Alternatively the signal specified for use in calibration can be used with one or more rendering devices and a single microphone. The system may instruct each rendering device in turn to emit a calibration pulse of a bandwidth appropriate for the rendering device. In order to discover the appropriate bandwidth, the calibration system may use a wideband calibration pulse and measure the bandwidth, and then adjust the bandwidth as needed. By using the characteristics of the calibration pulse, the calibration system can calculate the time delay, gain, frequency response, and phase response of the surround sound or other speaker system to the microphone. Based on that calculation, an inverse filter (LPC, ARMA, or other filter that exists in the art) that partially reverses the frequency and phase errors of the sound system can be calculated, and used in the sound system, along with delay and gain compensation, to equalize the acoustic performance of the rendering device and its surroundings.

While particular embodiments of the invention have been illustrated and described in detail herein, it should be understood that various changes and modifications might be made to the invention without departing from the scope and intent of the invention. The embodiments described herein are intended in all respects to be illustrative rather than restrictive. Alternate embodiments will become apparent to those skilled in the art to which the present invention pertains without departing from its scope.

From the foregoing it will be seen that this invention is one well adapted to attain all the ends and objects set forth above, together with other advantages, which are obvious and inherent to the system and method. It will be understood that certain features and sub-combinations are of utility and may be employed without reference to other features and subcombinations. This is contemplated and within the scope of the appended claims.

What is claimed is:

1. A calibration system for automatically calibrating an acoustic system, the acoustic system including a source A/V device, calibration computing device and at least one rendering device, the calibration system comprising:

calibration components attached to at least one selected rendering device, wherein the calibration components each comprise a microphone with an alignment relative to each other, and wherein the at least one selected rendering component includes an audio speaker that is a member of a surround sound system;

a sound source positioned in a preferred listening position with respect to the surround sound system, wherein the sound source is configured provide a single test signal at a precise time, wherein the test signal is broadcast as a flat frequency response band with sharp central correlation peak that is comparatively large in magnitude to a balance of the test signal; and a source calibration module operable from the calibration computing device, the source calibration module including calculation tools for automatically determining a position of the at least one selected rendering device, wherein determining the position comprises:

(a) initially guessing an overall speaker configuration, wherein the overall speaker configuration represents an arrangement of the at least one selected rendering device with respect to the at least one rendering device;

(b) recording a reception time at which each of the calibration components attached to at least one selected rendering device received the test signal;

(c) determining a distance and an angle between the at least one selected rendering device and the sound source at the preferred listening position, wherein the determined distance is based, in part, upon the precise time and the reception time, wherein the angle is based, in part, on the alignment of the calibration components;

(d) determining the x and y coordinates of the at least one selected rendering device with respect to the at least one rendering device, utilizing the angle and the distance, upon receiving information from the calibration components;

(e) revising the initial guess of the overall speaker configuration to align with the determined x and y coordinates of the at least one selected rendering device; and (f) utilizing the overall speaker configuration to determine the x, y, and z coordinates of the preferred listening position.

2. The calibration system of claim 1, wherein the calibration module comprises a coordinate determination module for determining coordinates in at least one plane of each selected rendering device relative to the preferred listening position.

3. The calibration system of claim 2, wherein the calibration module comprises a speaker selection module for selecting a test signal generating speaker and the sound source in the preferred listening position for generating the test signal.

4. The calibration system of claim 1, wherein the information comprises a test signal, the test signal comprising a bandwidth limited, flat frequency spectrum signal facilitating distinction between the test signal and background noise.

5. The calibration system of claim 1, wherein the information comprises a test signal, the test signal providing a sharp autocorrelation or autoconvolution peak enabling precise localization of events in time.

6. The calibration system of claim 1, wherein the information comprises a test signal and the calibration system implements a correlation method for performing matched filtering in the frequency domain, rejecting out-of-band noise, and decorrelating in-band noise signals.

7. The calibration system of claim 1, wherein the test signal comprises a flat bandwidth limited signal with a sharp autocorrelation or autoconvolution peak and performs matched filtering in the frequency domain.

8. The calibration system of claim 7, wherein the flat frequency response and autocorrelation properties of the signal are used to capture the frequency and phase response of a speaker system and at least one room containing the speaker system.

9. The calibration system of claim 8, wherein the calibration system partially corrects the captured properties of the speaker system and at least one room based on the captured phase and frequency response.

10. The calibration system of claim 1, wherein the calibration computing device comprises synchronization tools for synchronizing the calibration computing device and the at least one rendering device.

11. The calibration system of claim 1, wherein the calibration component comprises two microphones attached to at least one rendering device.

12. The calibration system of claim 11, wherein the two microphones are vertically aligned.

13. The calibration system of claim 11, wherein the two microphones are horizontally aligned.

14. The calibration system of claim 1, further comprising a room communication device connected over a network with the at least one rendering device.

15. A method for calibrating an acoustic system comprising: initially guessing at an overall speaker configuration, wherein the overall speaker configuration represents an arrangement of each of a plurality of rendering devices with respect to one another, and wherein each of the plurality of rendering devices are attached to audio speakers, respectively, that are members of a surround sound system; receiving a single test signal from a sound source in a preferred listening position, in relation to the surround sound system, at multiple microphones attached to each of the plurality of rendering devices, respectively, and recording a travel time associated with each of the microphones, wherein the test signal is broadcast as a flat frequency response band with sham central correlation peak that is comparatively large in magnitude to a balance of the test signal; transmitting information from the microphones to a calibration computing device; and automatically calculating, at the calibration computing device, a distance and an angle between each of the plurality of rendering devices and the preferred listening position based on the travel time of the received test signal to each of the microphones; determining the x and y coordinates of each of the plurality of rendering devices utilizing the angle and the distance; revising the initial guess of the overall speaker configuration to align with the determined x and y coordinates of each of the plurality of rendering devices; utilizing the overall speaker configuration to determine the x, y, and z coordinates of the preferred listening position; and calculating delays and gains associated with the plurality of rendering devices based on the coordinates of the preferred listening position.

16. The method of claim 15, further comprising using the calibration computing device to select a test signal generating speaker for rendering a test signal at a precise time.

17. The method of claim 16, further comprising receiving the single test signal at the plurality of rendering devices and providing the travel times of the single test signal, associated with each of the plurality of rendering devices, to the calibration computing device.

18. The method of claim 17, further comprising receiving the single test signal and each travel time with input processing tools of the calibration computing device.

19. The method of claim 18, further comprising time stamping each test signal received by the input processing tools.

20. The method of claim 19, further comprising automatically calculating, at the calibration computing device, a distance between each of the plurality of rendering devices and the selected test signal generating speaker.

21. The method of claim 20, further comprising automatically calculating at the calibration computing device each angle between each of the plurality of rendering devices.

22. The method of claim 20, further comprising determining x and y coordinates of each of the plurality of rendering devices relative to the preferred listening position.

23. The method of claim 15, further comprising synchronizing a source AV/device and the plurality of rendering devices.

24. The method of claim 15 further comprising remotely constructing a room pointing vector for pointing to a automatically controllable object in a room, wherein remotely constructing comprises:

receiving a first test signal from the sound source, wherein the sound source is configured as a sound generator provided in a user-actuated remote-control device;

determining a first reference point from the x, y, and z coordinates of the sound source utilizing the overall speaker configuration;

receiving a second test signal from the sound source upon being moved in a direction of the automatically controllable object;

determining a second reference point from the x, y, and z coordinates of the moved sound source utilizing the overall speaker configuration;

constructing the room pointing vector utilizing the first reference point and the second reference point.

25. The method of claim 24, further comprising:

utilizing the overall speaker configuration to determine x, y, and z coordinates of the automatically controllable object in a the room, with respect to the preferred listening position, by transmitting a test signal from the sound source at a physical location of the automatically controllable object in the room;

storing the x, y, and z coordinates in association with the automatically controllable object in a list of target devices;

determining the direction of the room pointing vector utilizing the overall speaker configuration; and identifying the automatically controllable object from the list of target devices detecting general intersection between the room pointing vector and the stored x, y, and z coordinates of the automatically controllable object.

26. The method of claim 25, further comprising controlling the identified automatically controllable object using the remote-controlled device.

27. The method of claim 15, further comprising measuring acoustic room response.

28. The method of claim 27, further comprising determining appropriate corrections to an audio stream based on room response.

29. The method of claim 28, further comprising allowing the corrected audio stream to be rendered by the plurality of rendering devices.

30. A computer readable medium storing the computer executable instructions for performing the method of claim 15.

31. A method for calibrating an acoustic system including at least a source A/V device, a sound source, and a first and a second rendering device, the method comprising: generating a single test signal from the sound source at a selected time, wherein the test signal is broadcast as a flat frequency response band with sharp central correlation peak that is comparatively large in magnitude to a balance of the test signal, wherein the sound source is positioned at a preferred listening distance respect to an overall speaker configuration, wherein the overall speaker configuration represents an arrangement of the first and the second rendering device with respect to one another, and wherein the first and the second rendering device are attached to audio speakers, respectively, that are members of a surround sound system; receiving the test signal at the first and the second rendering device at four or more reception times, wherein each of the four or more reception times corresponds with a respective microphones attached to the first and the second rendering device; transmitting information pertaining to the received test signal from the first and the second rendering device to the calibration computing device; and calculating a distance and an angle between the first and the second rendering device and the sound source based on the selected time and the reception times; utilizing the angle and the distance to determine the x and y coordinates of the first and the second rendering devices; utilizing the x and y coordinates of both the first and the second rendering devices to establish the arrangement of the overall speaker configuration and utilizing the established arrangement of the overall speaker configuration to determine the x, y, and z coordinates of the preferred listening position.

32. The method of claim 31, further comprising transmitting the received test signal and each reception time from the first and the second rendering device to the calibration computing device.

33. The method of claim 31, further comprising receiving the transmitted test signal and each reception time with input processing tools of the calibration computing device.

34. The method of claim 33, further comprising time stamping each test signal received by the input processing tools.

35. The method of claim 34, further comprising automatically calculating, at the calibration computing device, a distance and an angle between multiple rendering devices comprising the surround sound system with respect to each other.

36. The method of claim 35, further comprising determining coordinates of the first and the second rendering devices relative to the preferred listening position.

37. The method of claim 31, further comprising synchronizing the source A/V device with each rendering device.

38. A computer readable medium storing the computer executable instructions for performing the method of claim 31.

39. A calibration module operated by a computing device for automatically calibrating an acoustic system, the acoustic system including at least one rendering device having attached microphones the calibration module comprising:

input processing tools for receiving information from the microphones, wherein the information comprises a travel time of a test signal from a sound source to the at least one rendering device, wherein the sound source is positioned in a preferred listening position with respect to a surround sound system, wherein the surround sound system comprises the at least one rendering device and wherein the test signal is broadcast as a flat frequency response band with sharp central correlation peak that is comparatively large in magnitude to a balance of the test signal; and distance calculation tools for automatically determining a distance and an angle between the at least one rendering device attached to the microphones and the preferred listening distance based on the information from the microphones, for utilizing the angle and the distance to determine the x and y coordinates of the at least one rendering device, for determining an overall speaker configuration from the x and y coordinates, and for utilizing the overall speaker configuration to determine the x, y, and z coordinates of the preferred listening position.

40. The calibration module of claim 39, wherein at least one rendering device comprises a speaker.

41. The calibration module of claim 39, further comprising means for causing the sound source to play a test signal at a precise time.

42. The calibration module of claim 39, further comprising a coordinate determination module for determining coordinates of each rendering device of the surround sound system relative to the sound source.

43. The calibration module of claim 39, wherein the calibration computing device comprises synchronization tools for synchronizing the source A/V device and the at least one rendering device.

44. The calibration module of claim 10, wherein the input processing tools further comprise means for receiving the test signal from multiple microphones attached to the first and the second rendering devices.

45. A method for calibrating an acoustic system through transmission of a test signal, the method comprising:

transmitting the test signal from a sound source to a rendering device, the test signal comprising a flat frequency response band facilitating distinction between the test signal and background noise and a sharp central correlation peak that is comparatively large in magnitude to a balance of the test signal enabling precise measurement, wherein the rendering device is a member of a surround sound system and the sound source is positioned in a preferred listening position with respect to the surround sound system;

receiving the test signal at a microphones attached to the rendering device;

automatically calculating a distance and an angle between the rendering device and the sound source based on a travel time of the received test signal to each of the microphones;

utilizing the angle and the distance to determine the x and y coordinates of the rendering device;

determining an overall speaker configuration of the surround sound system from the x and y coordinates; and utilizing the overall speaker configuration to determine the x, y, and z coordinates of the preferred listening position.

46. A method for automatically calibrating a surround sound system including a plurality of speakers with a calibration system including a calibration computing device and a calibration module within at least one selected speaker, the method comprising: detecting a connection of the plurality of speakers with the calibration computing device; utilizing the calibration computing device to assume a speaker configuration that represents an arrangement of a plurality of rendering devices with respect to each other, wherein at least one of the plurality of speakers is attached to each of the plurality of rendering devices, playing a test signal from a sound source in a preferred listening position at a precise time; receiving the test signal at the calibration module located on a subject rendering device of the plurality of rendering devices; calculating a distance and an angle between the preferred listening position and the calibration module based upon a reception time of the test signal in view of the precise time of playing the test signal; and amending the arrangement of the assumed speaker configuration to align with the calculated distance and the calculated angle; and utilizing the checked speaker configuration to determine x, y, and z coordinates of the preferred listening position wherein the test signal is broadcast as a flat frequency response band with sham central correlation peak that is comparatively large in magnitude to a balance of the test signal.

47. The method of claim 46, further comprising repeating the test signal generation, receiving, and calculating steps for each of the plurality of speakers.

48. The method of claim 46, further comprising determining the location of each of the plurality of rendering devices with respect to one another based upon the calculations.

49. The method of claim 47, further comprising adjusting a delay of each speaker to allow a test signal generated from each speaker to reach the preferred listening position simultaneously.

50. A calibration method for calibrating a sound system having at least one rendering device, the calibration method comprising:

generating a calibration pulse from each of the at least one rendering device and a sound source in a preferred listening position, said calibration pulse is broadcast as a flat frequency response band with sharp central correlation peak that is comparatively large in magnitude to a balance of the test signal, wherein each of the at least one rendering device is a member of a surround sound system and the sound source is positioned in a preferred listening position with respect to the surround sound system;

utilizing a travel time of the calibration pulse between each of the at least one rendering device and the sound source to determine the x and y coordinates of each of the at least one rendering device with respect to one another;

determining an overall speaker configuration of the surround sound system from the x and y coordinates; and utilizing the overall speaker configuration to determine the x, y, and z coordinates of the preferred listening position;

calculating any of time delay, gain, and frequency response characteristics of the sound system the overall speak configuration; and creating an inverse filter based on any of the time delay, gain and frequency response characteristics for reversing at least one of frequency errors and phase errors of the sound system.

51. The method of claim 50, further comprising using a wideband probe signal to obtain a bandwidth for the calibration pulse.

52. The method of claim 50, further comprising equalizing the acoustic performance of each rendering device including its surroundings utilizing the inverse filter.

* * * * *

UNITED STATES PATENT AND TRADEMARK OFFICE

CERTIFICATE OF CORRECTION

PATENT NO. : 7,630,501 B2
APPLICATION NO. : 10/845127
DATED : December 8, 2009
INVENTOR(S) : Blank et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 981 days.

Signed and Sealed this

Second Day of November, 2010

David J. Kappos

*Director of the United States Patent and Trademark Office*